United States Patent [19]

Reynolds et al.

[11] 4,054,832

[45] Oct. 18, 1977

[54] SYSTEM AND METHOD OF MEASUREMENT OF INSULATION QUALITIES OF THREE-PHASE POWER EQUIPMENT

[75] Inventors: Peter H. Reynolds, Ambler; Donald S. Ironside, King of Prussia, both of Pa.; Joseph F. Barresi, Windsor, Conn.; Carl R. Scharle, Glenside, Pa.; Harry L. Latham, Bethayres, Pa.; Charles Saile, Norristown, Pa.

[73] Assignees: James G. Biddle Company, Plymouth Meeting, Pa.; Northeast Utilities Service Company, Berlin, Conn.

[21] Appl. No.: 624,421

[22] Filed: Oct. 21, 1975

[51] Int. Cl.$^2$ .................. G01R 27/16; G01R 31/12; G01R 31/02

[52] U.S. Cl. .................. 324/54; 324/107; 361/44

[58] Field of Search .......... 324/51, 54, 107, 108; 317/18 R, 18 B, 18 D, 27 R, 36; 340/255

[56] References Cited

U.S. PATENT DOCUMENTS

| 1,731,971 | 10/1929 | Courtin et al. ........... 317/18 R X |
| 3,158,785 | 11/1964 | Gagniere et al. ........... 317/18 D |
| 3,202,875 | 8/1965 | Bateman ........... 317/18 D |
| 3,259,802 | 7/1966 | Steen ........... 317/18 D |
| 3,340,432 | 9/1967 | Ainsworth ........... 317/27 R |
| 3,699,391 | 10/1972 | Eilts ........... 317/18 D |
| 3,938,006 | 2/1976 | Gadwal et al. ........... 324/51 X |

FOREIGN PATENT DOCUMENTS

| 1,057,276 | 3/1954 | France ........... 324/51 |
| 334,116 | 3/1921 | Germany ........... 324/51 |
| 923,292 | 4/1963 | United Kingdom ........... 324/51 |

Primary Examiner—Gerard R. Strecker
Attorney, Agent, or Firm—Dorfman, Herrell and Skillman

[57] ABSTRACT

Three-phase power equipment while still connected to the three-phase line has the insulation qualities of its various phases tested. All ground connections of said equipment except one are disconnected and that one is reconnected through ground current sensing means. Coupling units which may be capacitors are respectively connected between each of the three phases of the power line to which the power equipment is connected and ground. Each coupler unit is a reference phase current sensing means. Adjustable phase and magnitude adjustor means are used to couple the respective phase current sensing means to a summing means so that they are adding. The ground current sensing means is similarly coupled to the same summing means but opposed to phase current effects. A null detector coupled to the summing unit detects when balance occurs. Each of the phases is checked in sequence using fixed predetermined settings of the phase and magnitude adjusting means for the other two phases and separately and sequentially varying the settings of capacitance and dissipation factor for the phase under test until nulling occurs. Deviation in the settings of the adjustable phase and magnitude adjustor means from previous settings are considered in determining whether changes suggest deterioration of insulation and in which phase such deterioration may be occurring.

13 Claims, 17 Drawing Figures

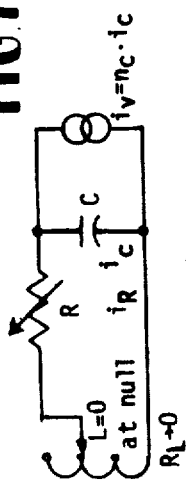
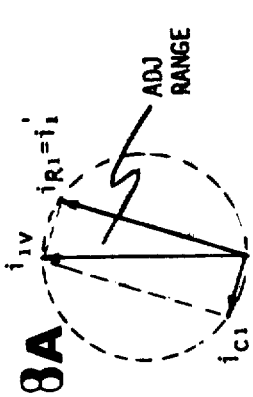
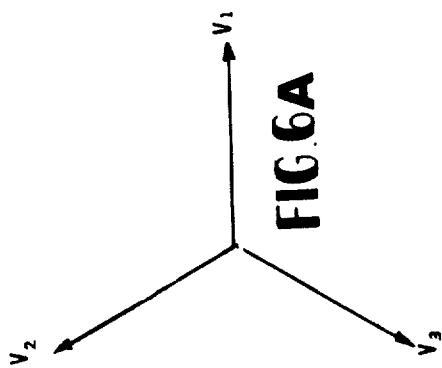
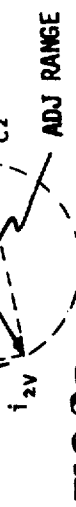
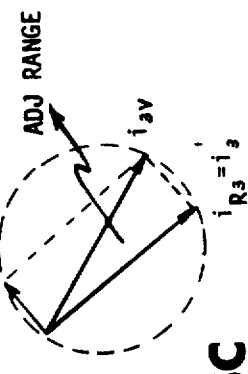
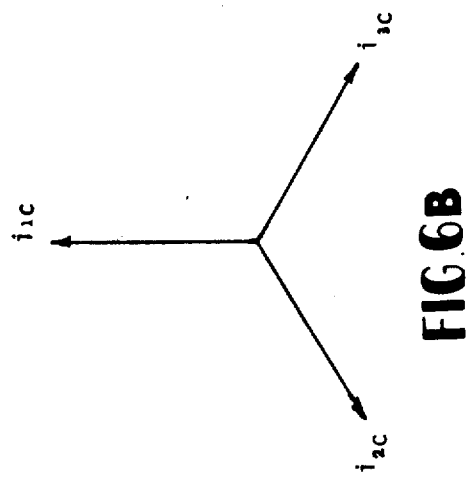
FIG.9
$n_e \cdot i_m = n_1 \cdot i_1' + n_2 \cdot i_2' + n_3 \cdot i_3'$
$i_j = 0$
FIG.7
FIG.8A
FIG.8B
FIG.8C
FIG.6A
FIG.6B

SYSTEM AND METHOD OF MEASUREMENT OF INSULATION QUALITIES OF THREE-PHASE POWER EQUIPMENT

The present invention is directed to a method and apparatus for monitoring insulation deterioration in alternating current equipment and especially in multi-phase equipment while still connected to the energized line in order to warn against potential failure of such equipment.

In recent years much development has occurred in connection with the measurement of insulation quality and dielectric capabilities. Not only has much been learned about dielectric measurements of all types but techniques have been developed for measuring dielectric properties of insulation as used in various pieces of equipment.

Various techniques have been developed to enable checking of dielectric properties of insulation in equipment as it is being manufactured and to make sure that that equipment will withstand types of voltage stress and other conditions of use for which it is intended. However, insulation may deteriorate in the use of the equipment and there has been no way to tell whether dielectric deterioration has occurred without removing the equipment from service. Because insulation deteriorates, not in any conventional predictable way, but in various ways dependent upon its environment and conditons of use, as well as the peculiar properties and defects of the material, the possibility of failure at any time potentially exists in every piece of equipment. Even considering insulation material alone, both physical and chemical properties may be involved and there may be inconsistencies in these properties from batch to batch of insulation, as well as small variations in the way it is installed.

The best available techniques to check insulation qualities in the prior art have involved removal of the equipment from the power line for examination and tests. Once removed from the power line single phase equipment has been difficult enough to check but three-phase equipment has been practically impossible except by single phase techniques. It is frequently not convenient to remove equipment from use to check its insulation qualities and a method of checking insulation qualities while equipment is still in use has been much needed.

The present invention is directed particularly to a system for monitoring energized equipment and method of its use for the detection, over a period of use, of deterioration in insulation, particularly in multi-phase equipment. It provides a technique for checking the equipment in its operating location while still in use with very minor modifications to the equipment connections. It functions to indicate whether the insulation condition remains essentially unchanged or is changing and, if changing, what is the approximate relative direction and magnitude of the change. When the degree of change becomes sufficient to merit concern of those monitoring it, only then is it necessary to remove the equipment from use for a more careful check or rebuilding. Thus, the present invention avoids the necessity of removing expensive equipment from service merely for tests, and minimizes the danger that that equipment may be severely damaged or destroyed by insulation failures.

More specifically, the present invention provides a system for detecting changes in insulation qualities of multi-phase equipment under operating conditions while the equipment remains connected between a multi-phase power line and ground. The system provides a coupler unit for each phase connectable between ground and one phase of the multi-phase power line to which the equipment under test is connected and provided with means for sensing the current passing through that coupler unit to provide a sample signal for that phase. Phase and amplitude adjustor means is provided for each phase to act upon the amplitude and phase of the current sensed from each coupler unit to modify the sample signal of that phase. Ground current sensing means is also provided for sensing current in the ground connection of the equipment to provide a ground current sample signal representative of equipment ground current. In a summing unit modified sample signals, respectively from each phase, as modified by the respective phase and amplitude adjustor means, are added and opposed to the ground current sample signal. Separate adjustments as to both phase and amplitude in each phase of the current samples will cause the sample signals to cancel one another when the phase and amplitude adjustor means are adjusted to simulate the cumulative effect of the phases of the equipment. Null detector means coupled to the summing unit will detect when such cancellation occurs.

In accordance with the present invention the equipment, as described, or other equipment, is used in a method of detecting changes in insulation qualities of the various phases of a multi-phase power equipment while the equipment remains connected between the multi-phase power line and ground. This method involves disconnecting all ground connections of said equipment except one and connecting a ground current sensing means therein to derive a sample signal representative of ground current. Separate coupler units are connected between each different phase of the multi-phase power line, to which the multi-phase power equipment is attached, and grounded. Current passing through each coupler unit is then sensed to provide a sample signal for that phase. Each coupler unit has associated with it separate calibrated phase and amplitude adjustor means for the purpose of effectively changing amplitude and phase angle of the sample signal representative of current in that phase. Sample signals representative of phase currents are added and opposed to the sample signals representative of ground current in a summing unit having a null detector. Setting all but one of the phase and amplitude adjustor means at predetermined fixed settings simulating the conditions in the corresponding phase of equipment at a reference point of time establishes a basis from which variation can take place. The settings of phase and amplitude of that one phase are then adjusted until the null detector shows null in order to obtain readings representative of capacitive and dissipation factors in that phase of the equipment under test. The same procedure is preferably repeated for each of the other phases. Readings of each phase are then compared with prior readings of the corresponding phases to detect changes in insulation properties in each of those phases.

For a better understanding of the present invention reference is made to the accompanying drawings in which:

FIG. 6A is a three-phase voltage vector diagram showing voltages in the three coupler capcitor units of FIG. 3;

FIG. 6B is a vector diagram showing currents flowing in these three coupler capacitors;

FIG. 7 is an equivalent circuit diagram illustrating the functions of the two adjustments of a phase shifter means in accordance with the present invention;

FIG. 8A, 8B and 8C are corresponding vector diagrams illustrating currents present in the phase shifter means of the invention and applicable to FIG. 7;

Figure 10:
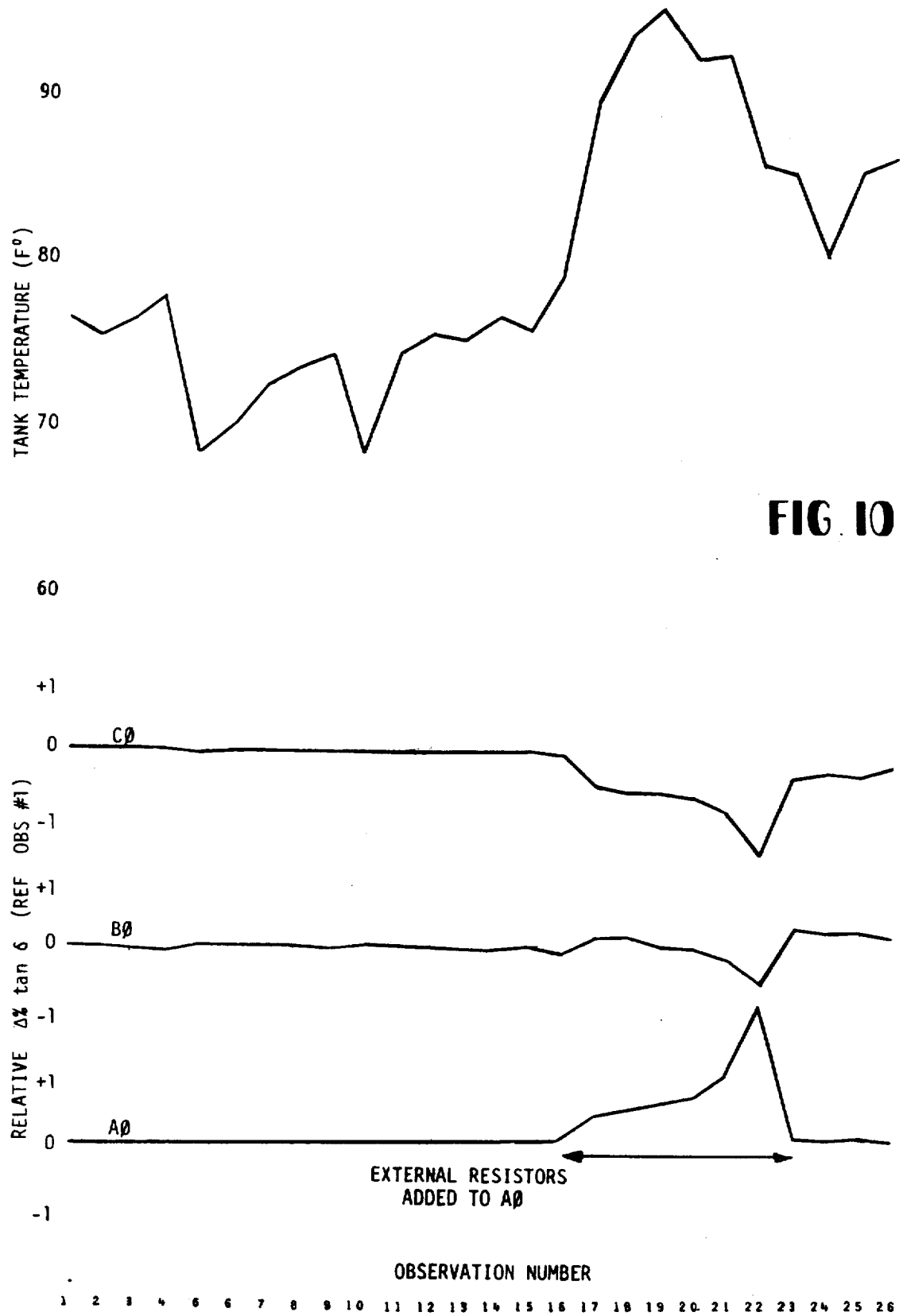

FIG. 9 is a vector diagram showing relationships of the ampere-turn vectors $n_1.i_1'$, $n_2.i_2'$ and $n_3.i_3'$ to obtain $n_e i_m'$ as defined in FIGS. 3, 8A, 8B and 8C; and FIG. 10 is a composite of a test graph using equipment in the present invention showing relative phase variations of the various phase currents for common observation intervals and a separate plot of temperature over the same intervals.

The present invention is directed to a means and method of monitoring insulation deterioration by a program of periodic examinations which are relatively simple and inexpensive to make, and as a result of which, it is possible to warn against, at the location of equipment installation while still energized, when insulation is in danger of failure.

Equipment which may be subject to measurements in accordance with the present invention includes three-phase transformers, three-phase circuit breakers, three-phase capacitive arrays and other three-phase equipment. Single phase measurements may also be made. The purpose of the measurement is to avoid removal of the equipment from service for a routine check. The invention also would avoid loss of the use of the equipment necessitating substitution of standby equipment, for which there may be no other standby equipment readily available.

In making the present invention, it was necessary to consider and eliminate a great many possibilities. One question considered was what should be measured in order to determine insulation quality. Part of the problem in a piece of three-phase eqiupment is that, if it is to be left in service in the field, there are relatively few options compared to handling the equipment in the shop. Removal from service permits individual phases to be examined separately. Extensive experiments were, therefore, made on the leakage current to ground in an effort to resolve the three phases of insulation current. This work assumed some sort of a common connection from the three phases to ground, which ordinarily will include a substantial grounding means, such as a grid mat of conductive metal wire which has been buried in the earth. Often there are multiple connections to ground, but in order to obtain a measure of all insulation current which flows, it was determined that it is necessary to first disconnect all ground leads except one, and make the measurement within that one remaining ground level. Elimination of other ground leads avoids the possibility of circulation of currents up one ground lead and down another. Actual measurement of current may involve interruption of one lead while leaving others connected for safety reasons for insertion of a current transformer primary or other appropriate low impedance means to facilitate the measurement. Low impedance is required in order not to impair the function of the ground connection during the time of the measurement. The measurement of insulation ground current is difficult because of its small magnitude, which might ordinarily in a piece of good equipment range from zero to one hundred microamperes with significant changes requiring measurement of very small variations from an initial measurement.

Apart from the ground connection, the equipment used in making the measurements and generating a comparison needed to be simple, easy to be, and reasonably low cost. In addition to problems involving connections to relatively high voltage power lines, there were problems of components of test equipment being influenced by fields by the vicinity of the transmission line. It was decided that it would be most satisfactory to employ coupling units to derive measurable phase currents in parallel with the equipment leakage path across the same three-phase power lines. While the coupling unit selected employed coupling capacitors great variation in the types of coupler units may be employed. Similarly while current transformers provided a simple way to sample both ground current of the equipment and phase currents through the capacitors other means might well be employed. The phase and amplitude adjustor means include separately adjustable components calibrated in terms convenient for the interpretation of the test results. The circuit or other means of adjustment of these effects is, of course, subject to wide variations. While other techniques might be used, this simple type of phase and amplitude adjuster in combination with coupling capacitors is preferred to generate currents of the relative relationship prevailing in the corresponding phases of the equipment under test. In starting tests, each amplitude adjustment means is set to a calibrated amount and the phase angle is set to a calibrated amount corresponding to those parameters in the corresponding phase of the equipment under test when it was installed. Those parameters may either have been actually measured in a single phase measurement of the equipment, or derived from data from similar equipment, or otherwise arbitrarily, but intelligently, selected to be representative. Thus, with six settings for the three phases, an approximation of the insulation current in the equipment connected to the same power line is created. Because this approximation is representative of the equipment when it was first installed, or when it was manufactured before it was installed, changes relative to these settings represent a good approximation of changes in that equipment for comparison with the actual equipment under test. The changes are detected by making adjustment within one phase at a time and observing the null detector to compare the model and equipment under test until null occurs. Nulling for phase angle and amplitude may be observed, for example, on an oscilloscope. Since such comparison involves calibrated modification of the amplitude and phase angle values of an individual phase while holding the other phases constant, when the insulation in only one phase of the equipment has changed the comparison will tend to show a trend in changes rather than any absolute measurements of insulation leakage current and phase angle for a given phase. Such a trend and, particularly a large change in insulation current, can be indicative of a dangerous condition in the insulation.

Figure 1:
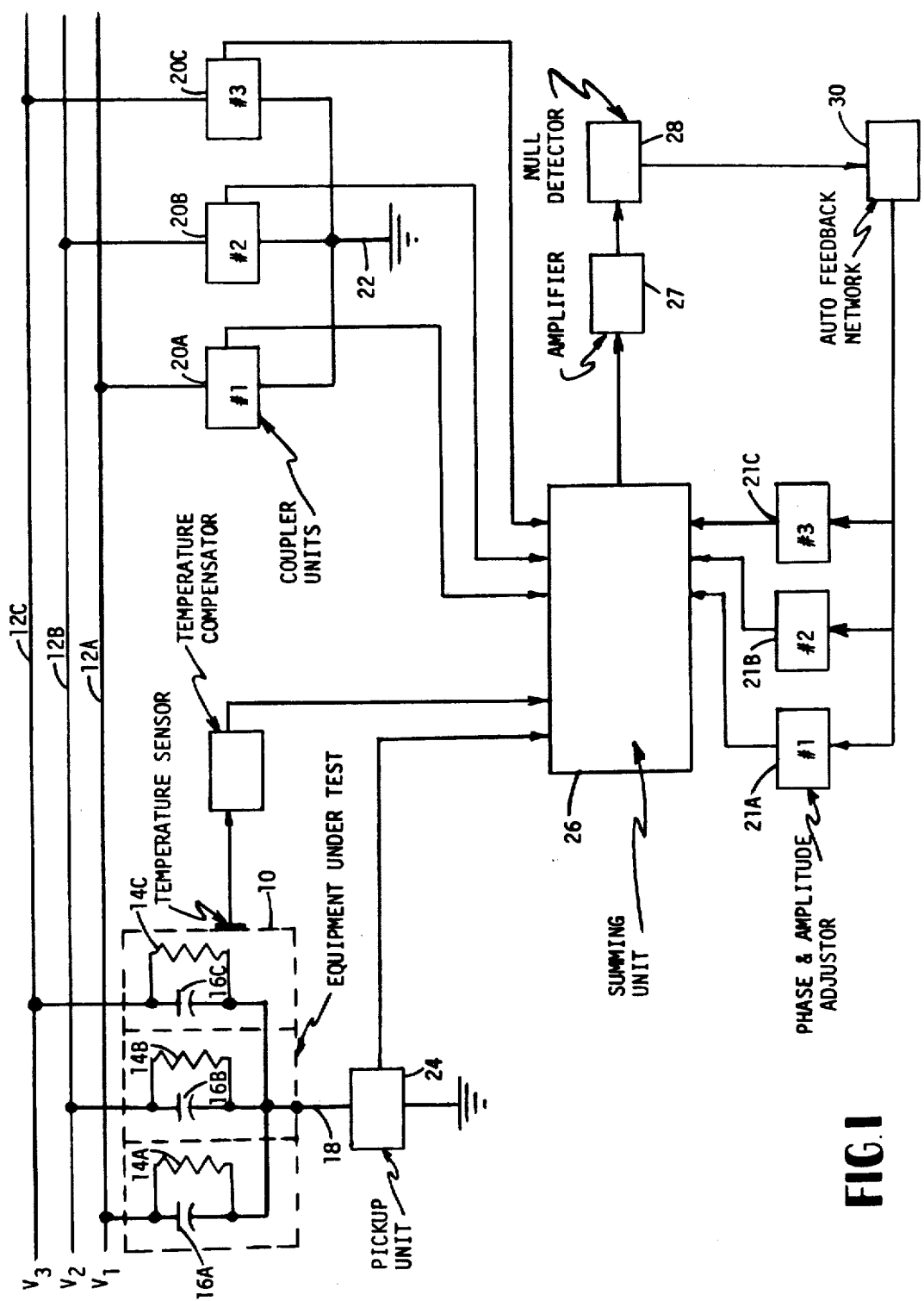
FIG. 1 is a schematic block diagram showing an energized three-phase system for measuring insulation qualities of each phase in accordance with the present invention.
Figure 2:
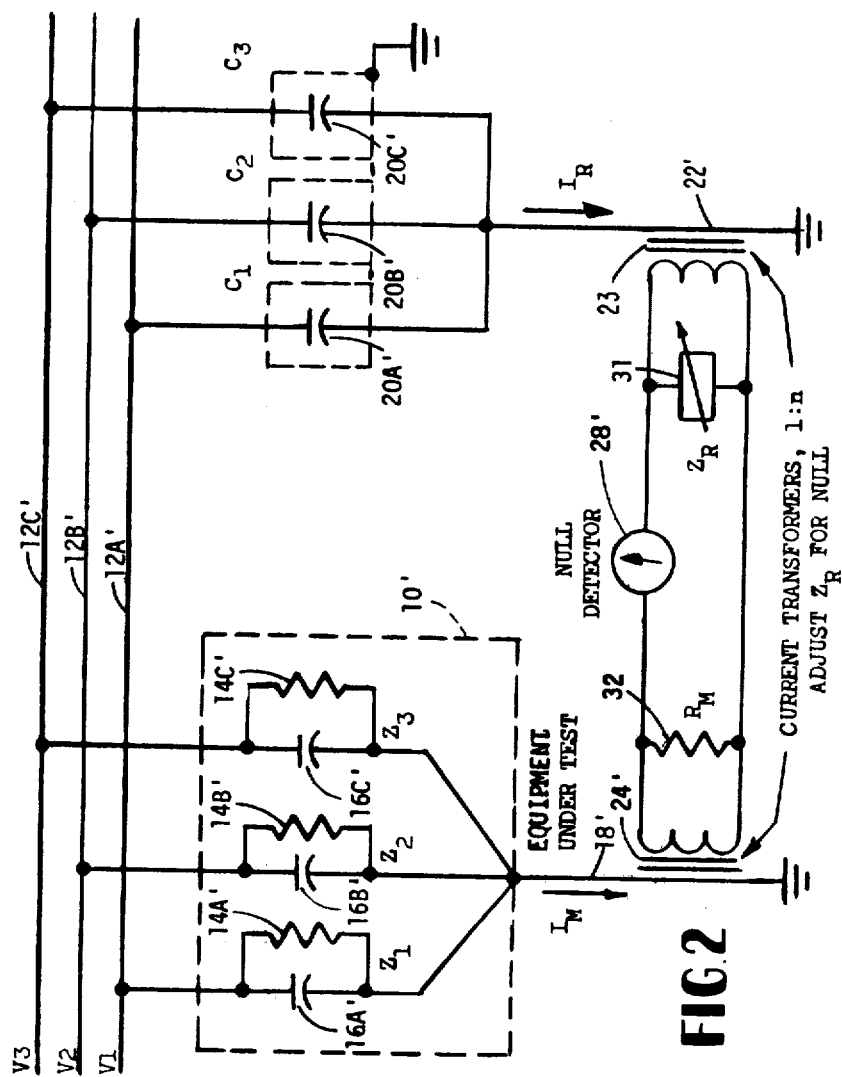
FIG. 2 is a theoretical circuit representative of the system of FIG. 1 permitting mathematical analysis.

It will be helpful to consider further the nature of the technique employed before specific equipment is considered and to this purpose the diagrams of FIGS. 1 and 2 are highly informative in derving such understanding.

An elementary circuit shown in FIG. 1 provides a means of detecting the magnitude and phase angle of the current to ground due to capacitance and losses of the insulation. A grounded system is assured. The current is detected by a current transformer placed in the ground lead of the equipment. The current is fed into a bridge arrangement which compares it to the sum of similar currents which flow to ground through reference capacitors connected to the line.

When applied to single-phase equipment, this system operates in a manner similar to a dissipation factor bridge, (for an example, see the James G. Biddle Company dissipation factor bridge), except that the equipment is energized by the line voltage during test. It should be noted that the present invention may be applied to single-phase equipment with the advantage that test may be made while equipment is in use. Then if further tests are required, greater precision measurement may be made after the equipment is removed from the line.

When applied to three-phase equipment, the reading obtained is not simply a function of insulation dissipation factor but is a complicated result of many conditions. The quantity measured in this case may be referred to as the "three-phase insulation current."

FIG. 1 illustrates a three-phase apparatus such as a three-phase circuit breaker generally designated 10. The leakage current path to ground through the insulation of the equipment connected to the three-phase power line 12A, 12B and 12C consists of the insulation current path which may be represented by an equivalent circuit of lumped resistances 14A, 14B and 14C, respectively in parallel with lumped capacitances 16A, 16B and 16C all connected in wye to ground through common ground connection 18. It will be understood that this ground connection is the one remaining ground connection employed in the test of the apparatus, as previously discussed. The test equipment consists of three coupler units 20A, 20B and 20C connected between the respective power lines 12A, 12B and 12C and ground through a common line 22. Ground line 18 is provided with a pickup unit 24. Each coupler unit includes sampling means for sampling current passing through that coupler unit. The sampled phase currents are modified by associated phase and amplitude adjustor means 21A, 21B and 21C, to modify separately amplitude and phase of the current sampled and fed to summing unit 26. Summing unit 26 sums phase currents and places them in opposition to ground current sampled by pickup unit 24. Any difference is amplified by amplifier 27 and displayed on null detector 28. Detector 28 may be a complex device analyzing sequentially (or possibly simultaneously) nulls for both phase and amplitude in each phase with respect to preset fixed values in other phases. In such case, automatic feedback network 30 to correct each value toward balance may be applied to sequentially correct A, B or C phase through phase shifters 21A, 21B or 21C one phase at a time until null occurs for each phase.

FIG. 2 is intended to be schematic but may be said to be the circuit of the system of FIG. 1 but without feedback or separate phase and amplitude adjustors. FIG. 2 illustrates circuitry for a system of measuring a three-phase equipment generally designated 10'. The current path to ground through the insulation of the equipment connected to the three-phase power line 12A', 12B' and 12C' consists of the insulation current path which may be represented by an equivalent circuit of lumped resistances 14A', 14B' and 14C', respectively in parallel with lumped capacitance 16A', 16B' and 16C' all connected in wye to ground through common ground connection 18'. This ground connection is the one remaining ground connection employed in the test of the equipment under test 10'. The coupler units consists of three capacitors 20A', 20B' and 20C' having one plate connected between the respective power lines 12A', 12B' and 12C' and the other plate connected to ground. Each of the capacitors may be shielded and this shield is connected to ground to minimize interference. Ground line 18' is provided with a current transformer 24' as its pickup unit and ground line 22' with a current transformer 23 connected in opposition across null detector 28' in a bridge or balance arrangement. It is possible to employ a single-phase shifting network 31 having an adjustable impedance to adjust the overall effect of the coupler units with respect to the equipment under test. A shunt resistance 32, which may be selected to correspond to the expected ground current range is connected across the secondary of transformer 24'.

It will be observed that FIG. 2 has designations of various voltages, impedances, capacitances and the like, in this system, which are used in the following mathematical demonstration:

An infinite number of different combinations of the reference elements $C_1$, $C_2$, $C_3$ and $Z_R$ can produce a null condition, but only when the reference C's and the unknown Z's are in the same ratio to each other is the null independent of line voltage.

Referring to FIG. 2, at null:

$$I_M \frac{R_M}{n} = I_R \frac{Z_R}{n}$$

or $$\left(\frac{V_1}{Z_1} + \frac{V_2}{Z_2} + \frac{V_3}{Z_3}\right) \times \frac{R_M}{n} = \left(\frac{V_1}{X_{c_1}} + \frac{V_2}{X_{c_2}} + \frac{V_3}{X_{c_3}}\right) \times \frac{Z_R}{n}$$

Setting the C's and Z's in the same ratios:

$$\frac{X_{c_2}}{X_{c_1}} = \frac{Z_2}{Z_1} \triangleq \alpha$$

and $$\frac{X_{c_3}}{X_{c_1}} = \frac{Z_3}{Z_1} \triangleq \beta$$

We have $$\left(\frac{V_1}{Z_1} + \frac{V_2}{\alpha Z_1} + \frac{V_3}{\beta Z_1}\right)\frac{R_M}{n} = \left(\frac{V_1}{X_{c_1}} + \frac{V_2}{\alpha X_{c_1}} + \right.$$

-continued $$\left. \frac{V3}{\beta X_{c_1}} \right) \frac{Z_R}{n}$$

from which $$\frac{R_M}{Z_1} = \frac{Z_R}{X_{c_1}}$$

or $$Z_1 = X_{c_1} \frac{R_M}{Z_R}$$

Likewise, $$Z_2 = X_{c_2} \frac{R_M}{Z_R}$$

$$Z_3 = X_{c_3} \frac{R_M}{Z_R}$$

The above equations indicate that when $X_c$'s are set in the correct ratio, a null can be found by adjusting $Z_R$, and also that changes in line voltage will not affect the null setting.

For example, changes in $Z_1$ due to deterioration of insulation will be detected by either a change in null setting or the inability to reach null.

Figure 2A:
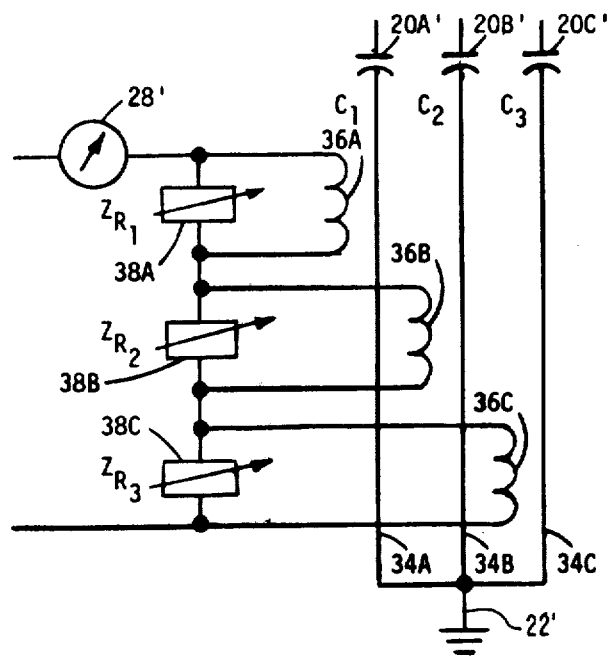
FIG. 2A is a partial modification of the circuit of FIG. 2.

FIG. 2a illustrates a modified portion of the circuit of FIG. 2 showing variation of coupling.

In FIG. 2A instead of sensing the current in the common ground line 22', current is sensed in each of the phase lines 34A, 34B and 34C. No longer is there just one current transformer employed. Instead three transformers 36A, 36B and 36C, one for each phase, are used. Across each secondary of the respective transformers is connected a separate phase and amplitude adjusting network 38A, 38B and 38C, respectively.

The refinement shown in FIG. 2A allows greater flexibility in that a null can be found for any set of Z's. At null:

$$\left( \frac{V1}{Z_1} + \frac{V2}{Z_2} + \frac{V3}{Z_3} \right) \frac{R_M}{n} =$$

$$\left( \frac{V1}{X_{c_1}} \times \frac{Z_{R_1}}{n} + \frac{V2}{X_{c_2}} \times \frac{Z_{R_2}}{n} + \frac{V3}{X_{c_3}} \times \frac{Z_{R_3}}{n} \right)$$

In this condition, a null can always be reached by adjusting the three $Z_R$'s; in fact, an infinite number of null conditions exist.

If, we select the case where $$\frac{X_{c_2}/Z_{R_2}}{X_{c_1}/Z_{R_1}} \triangleq \alpha = \frac{Z_2}{Z_1}$$

$$\frac{X_{c_3}/Z_{R_3}}{X_{c_1}/Z_{R_1}} \triangleq \beta = \frac{Z_3}{Z_1}$$

where $\alpha$ and $\beta$ are vector quantities, we have at null $$\frac{R_M}{nZ_1} = \frac{Z_{R_1}}{nX_{c_1}}$$

and again line voltage has no effect on the null condition.

The question arises as to how to find null if one of the Z's changes. Starting with the original settings of $Z_R$ dials, there are various ways to resolve the deviation vector. One is to use the $Z_R$ dials. For example, if they can be changed in amplitude while fixed in phase angle, one can be left fixed and the other two can be adjusted to a unique new null. The deviation current can be defined in amplitude and phase from the difference in the old and new null settings. The magnitude and phase of the deviation itself are not free of line voltage effect, since the new null selected from the infinite number of possible nulls is unlikely to be the unique voltage-insensitive null. However, this is a second-order effect and should not significantly affect the value of the results.

Figure 3:
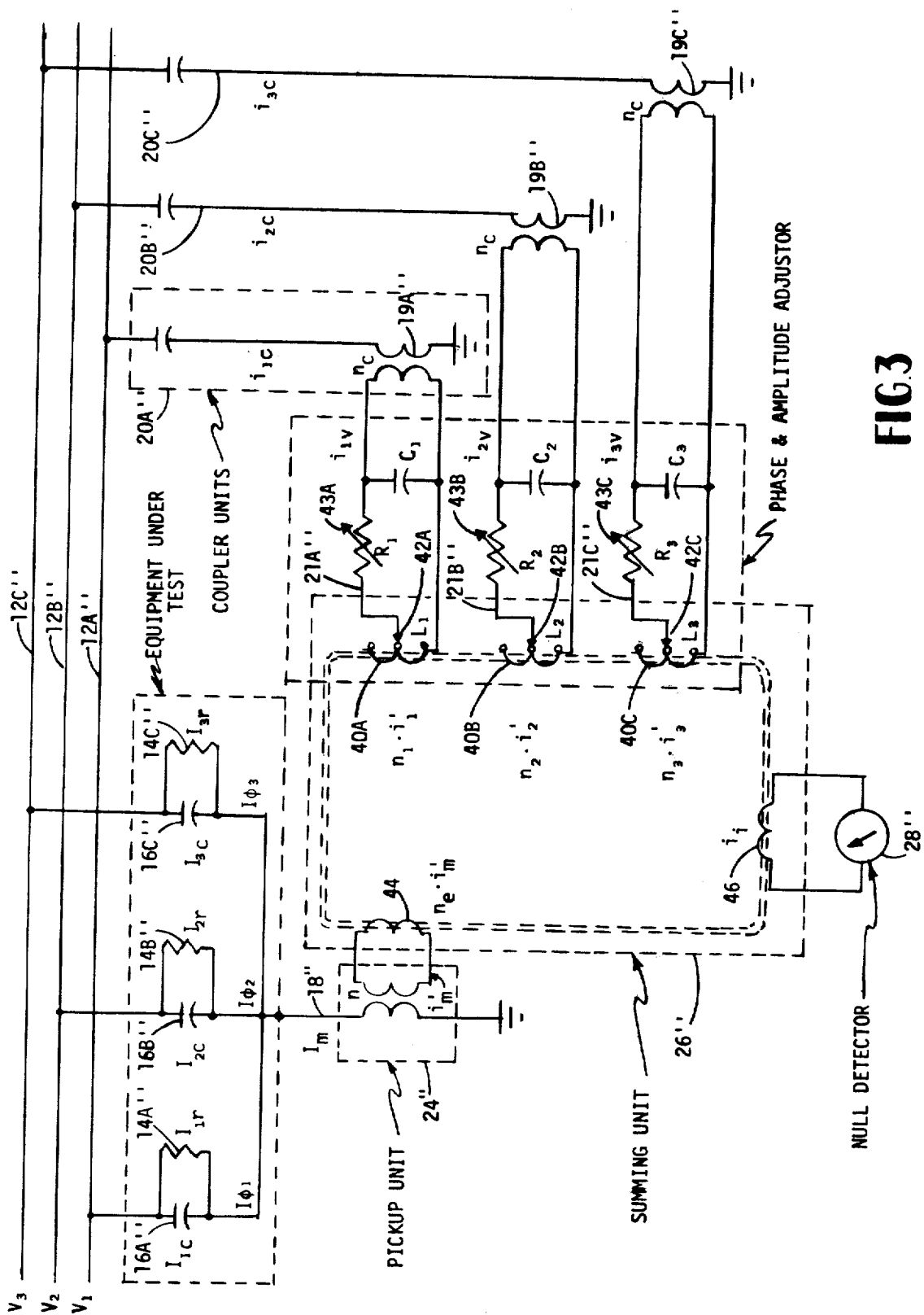
FIG. 3 is a circuit diagram showing a practical embodiment of the system of FIG. 1.

In practice, preferred apparatus in accordance with the present invention is similar to that shown schematically in FIG. 3. FIG. 3 expands upon the detail of the test equipment. For clarity corresponding parts use the same number designators employed in FIGS. 1, 2 and 2A with the addition of double primes. In particular, the dually adjustable nature of the phase and amplitude adjustor means in practical equipment is shown schematically more accurately. The primaries of current transformers are shown schematically as a winding, as is the secondary. The phase shifters for the respective phases 21A'', 21B'' and 21C'' are shown across the secondaries, which, however, in this instance, are connected to an ampere-turn summing transformer still bearing general designator 26''. Windings 40A, 40B and 40C of the phase and amplitude adjustors are arranged to sum their inputs. Connected in opposition to these windings is ground current winding 44, connected to the secondary of current transformer, ground current pickup unit 24'', the primary of which is in series with the sole remaining ground connection 18''. It should be noticed that turns changing taps 42A, 42B and 42C respectively constitute the amplitude adjustment of phase and amplitude adjustor means 21A'', 21B'' and 21C'', in this case by changing the turns in the windings 40A, 40B and 40C. The variable resistors 43A, 43B and 43C account for phase adjustment. Each of these adjustable elements is provided with a calibrated dial to permit adjustment readings, as well as resetting to predetermined values. Calibration in the equipment under test may be conveniently expressed in terms of capacitance for the tap changers 42A, 42B and 42C. For the variable resistors 43A, 43B and 43C the scale may conveniently by expressed in terms of dissipation factor (tan $\delta$). Unbalance or balance of magnetomotive force (mmf) produced by ampere-turns in the summing unit 26'' is sensed through sensing winding 46. Sensing winding 46 is, in turn, connected to an amplitude and phase sensitive null detector 28'' (preferably an oscilloscope) which permits separate nulling as to amplitude in terms of the ampere-turns adjustment and phase in terms of the resistive adjustment of the two components of the phase and amplitude adjustor means in only one phase at a time.

The use of the apparatus of FIG. 3 is of particular interest in connection with the method of the present invention. As a practical matter, in use, the apparatus shown in FIG. 3 is first appropriately adjusted for initial settings using the amplitude (capacitance) and phase angle (dissipation factor) variables of the phase and amplitude adjustor means. This can best be done by determining, when the equipment is new, the settings for the capacitance and dissipation factor in each phase. The capacitance and dissipation factor settings are derivable for a particular equipment under test when it is new. The preferred method of doing this is to use the system itself as a single phase apparatus measuring the respective phases of the equipment under test in succession and matching each phase of the apparatus against the corresponding phase of the equipment. In the usual situation it will be desirable to disconnect the equipment from the power line and connect it to a separate power supply. Alternatively, another separate piece of single phase insulation measuring equipment could be used to measure the capacitance and dissipation factor used for each phase separately. If neither technique is convenient, specifications for the particular equipment or for that type of equipment in general may be used, or any other reasonable source of such data may be used. Once selected, these settings must always be used as the standard for that equipment thoughout subsequent tests. These settings should be selected carefully and as accurately as possible to achieve the maximum rejection of line voltage effect upon test results.

More precisely, at the start of any test, the settings of capacitance and dissipation factor are fixed in phase and amplitude adjustors 21A", 21B" and 21C" at these original values for the equipment under test. Thereafter, these factors are then individually varied one variable at a time. For example, tap 42A is adjusted until magnitude is nulled. Next, resistor 43A of phase adjustment 21A" may be varied until current phase angle null ocurs. The settings of resistor 43A and tap 42A are noted and resistor 43A and tap 42A are then returned to the original values. The same adjustment procedure is followed with other phases in turn. Using the three phases sequentially, independent of each other, a selection of settings for each phase is obtained that is meaningful as to changes which have occurred in insulation. Deviations from the initial settings and prior test settings are indicative of insulation changes which have occurred.

Figure 4A:
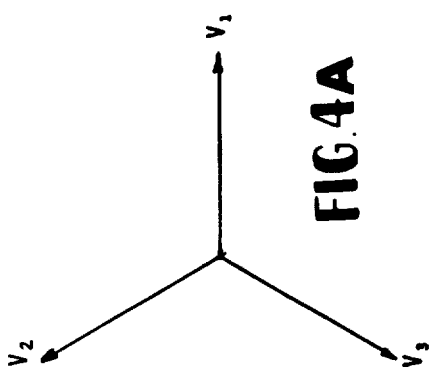
FIG. 4A is a three-phase voltage vector diagram showing the relationship of voltages in the three phases of equipment under test.
Figure 4B:
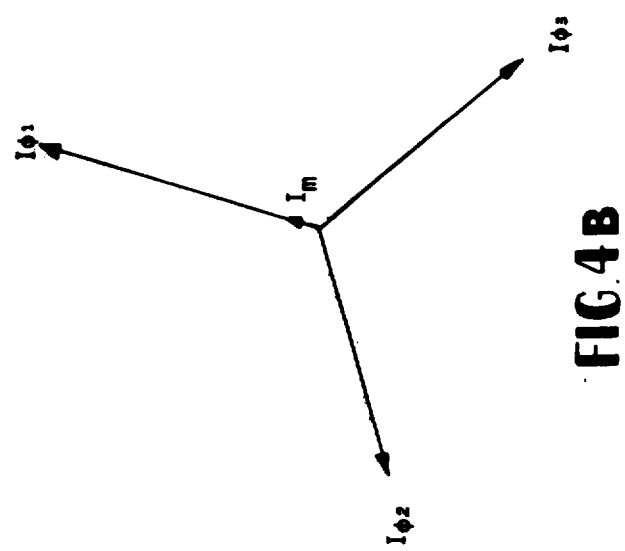
FIG. 4B is a vector diagram showing currents flowing in the three phases of equipment under test and ground current.

The method of the present invention may perhaps be better understood by reference to the schematic diagram FIG. 3 and the voltage and current vector diagrams of FIG. 4A and 4B which are of a conventional type representing the three-phase system voltages and insulation currents in the equipment under test. As seen in FIG. 3 the voltages are applied from lines 12A", 12B" and 12C". As seen, the insulation phase currents are not 90° out of phase with their voltage vectors. It is the nature of a three-phase power system to provide voltages which are the same in amplitude and frequency and out of phase with one another 120°.

The currents will lead the voltages in an insulation system which is essentially capacitive in nature. The amount of lead is somewhat variable in accordance with the insulation parameters. The total current to ground $I_m$ is in phase with the current of the first phase $I_{\phi1}$ showing that $I_{\phi1}$ has an amplitude larger than the other currents $I_{\phi2}$ and $I_{\phi3}$ by an amount equal to $I_m$. The phase currents if equal in amplitude and in 120° symmetry with one another would, of course, balance out so that there would be no ground current.

In the course of the method of the present invention, each of the two adjustments is made in each phase and amplitude adjustor in sequence in various phases, as described, to achieve null with $I_m$. In the simple situation illustrated, adjustment of the turns adjustment tap 42A, will cancel the effect of current $I_m$ as shown by the null detector. The adjustment method is described in further detail in the following paragraphs.

Figure 5A:
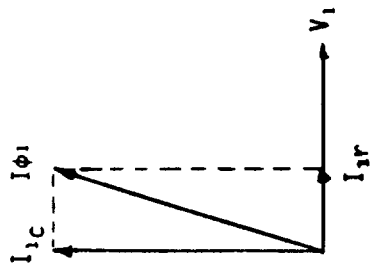
FIGS. 5A, 5B, 5C are diagrams resolving the current vector for each of the respective phases into its resistance and capacitive components.
Figure 5B:
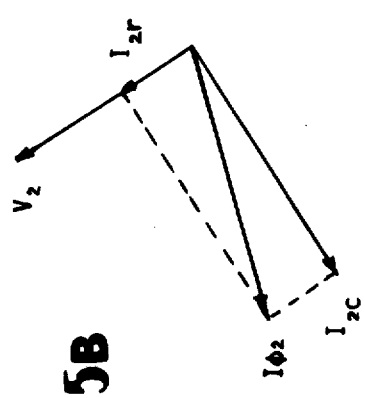
Figure 5C:
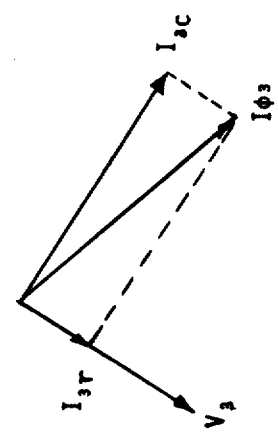

FIGS. 5A, 5B and 5C show the relationships between the voltage and the current vectors in each of the respective phases of the equipment under test put into proper phase relationship relative to the diagrams of FIGS. 4A annd 4B. Furthermore, FIGS. 5A, 5B and 5C resolve each phase current into its pure capacitive and resistive components.

FIGS. 6A and 6B represent relative voltages and currents in the coupling units, particularly capacitors 20A", 20B", and 20C". The voltages correspond to line voltages and are similarly designated and phased so that they compare directly with those of FIG. 4A. The currents $i_{1c}$, $i_{2c}$ and $i_{3c}$, which can also be identified in FIG. 3, because of the almost pure capacitive nature of the coupling unit lead the voltages by 90°. The current transformers are presumed to be identical and each has been shown as having a turns ratio of $n_c$. That being the case, the current out of each coupler unit $i_v$ equals the product $n_c.i_c$ in each phase.

The operation of each phase and amplitude adjustor unit is the same and is represented in the equivalent circuit of FIG. 7. FIGS. 8A, 8B and 8C represent currents found in each phase in the phase shifter of which FIG. 7 is a model with the total currents $i_{1v}$, $i_{2v}$ and $i_{3v}$ being shown in FIG. 3. In each case the $i_c$ component flows through the capacitor and the $i_R$ component flows through the resistor. It is the $i_R$ component shown in FIG. 8A as also equal to $i_1'$ which flows through the windings 40A, 40B and 40C to produce the effective magnetomotive force to be nulled out by summing unit 26". Adjustment of the phase proceeds by adjustment of R in FIG. 7 which, in turn, changes the phase angle of $i_R$ relative to the phase of the vector $i_v$. This change in R causes only an insignificantly small change in magnitude of $i_R$ if R is small compared to the reactance of C. The magnitude of the effect of $i_R$ is controlled by adjustment of number of turns at 42A on FIG. 3. Thus the ampere-turn product $n_1.i_1'$ represents the phase current $i_{1c}$ modified by $n_c$ and the calibrated phase adjustment 43A and the turns selection 42A.

In like manner the other two phase currents $i_{2c}$ and $i_{3c}$ are represented by $n_2 i_2'$ and $n_3 i_3'$.

FIG. 9 shows the relationship of ampere-turn vectors from the coupler units and pickup unit after the adjustment null. The associated formula illustrates that the associated magnetomotive forces of each coupler unit combined just cancel the mmf generated by the ground current at null, namely, $n_m i_m' = n_1.i_1' + n_2.i_2' + n_3.i_3'$ in the situation where the total mmf in the summing unit equals O or balance is achieved.

The magnitude and phase angle adjustments may be intepreted in terms of capacitance and dissipation factor of the corresponding phases of the equipment under test by means conventional in the art of AC bridge measurements and the instrument dials may be so calibrated.

FIG. 10 is a set of related graphs which show change in null settings of dissipation factor platted against a time axis, the time being common points of observation which may or may not be at uniform intervals. The lower graphs are plots of percentage change in dissipation factor for each of the respective phases. Corresponding plots could be made for capacitance change in the various phases, but, in practice it is more usual for variations to appear as changes in dissipation factor and such plots would add little under such circumstances. Dissipation factor (tan δ) will be recognized to be essentially the equivalent (for small angles δ) of cosine θ (power factor) where δ and θ are complementary angles and θ is the phase angle between the current and the voltage vector. Thus, these diagrams show phase changes over a period of time. In this case, the plot was made by simulating insulation failure of one phase of a circuit breaker having three phases in which changes were simulated by adding resistors in parallel with one phase of the circuit breaker. The observations 1 through 16 represent the equipment which has had no change, or essentially no change, in its dissipation factor other than that resulting from a change in temperature as seen by the plot at the top of the graph. The temperature in this case ranges from 68° to 78.8° F. Observations 17 through 22 were the result of the dissipation factor of phase A being diliberately changed by inserting successive resistors of the value of 1500, 1250, 1000, 750, 500 and 250 megohms respectively, during which observations the temperature ranged from 78.4° to 95.2° F. Observations 23 through 26 represent a return to the original condition without resistors, during which observations the temperature ranged from 80° to 86° F.

Were this set of results to occur in use, the user would at the time of observation 22, for example have a choice of 3 interpretations. Phase A may have increased dissipation factor by about 2%, or Phase B may have decreased by ⅓% or phase C may have decreased by 1¼. He would be well advised to suspect the Phase A change since the other two changes represent improvement in dissipation factor which is physically unlikely in actual equipment. Such a marked increases in dissipation factor justifies removing the equipment from service for maintaince at the earliest opportunity. It is also possible for the observed change to be caused by a combination of changes of C and/or DF in two phases at once; the probability of such combination changes and the likelihood of their indicating a dangerous deterioration depends on the particular piece of equipment and its history.

It is to be noted from FIG. 10 that over relatively narrow ranges of temperature, very little change occurs in the settings of capacitance and dissipation factor provided there is no change in the insulation condition.

It is also true that by observation, if little or no change occurs in the settings, there is small likelihood of any significant deterioration of insulation. Whenever change occurs, insulation deterioration would be suspected and, if that change became relatively large, serious problems would appear to exist, suggesting removal of the equipment from service for further tests.

The present invention is intended to provide an approach to solution of a problem. Problems may vary depending on such variables as types of equipment, type of insulation, voltages and other parameters, type of service and other factors.

The method of the present invention or the use of systems in accordance with the present invention will result in the collection of data in the form of various dial settings for each period of observation. How variations in such data are interpreted will depend on individual skills developed by users of the system and method for each particular application. The many uses of the invention in such diverse applications is contemplated by the present invention. Whatever diverse techniques may be employed using the invention, the data obtained by the present invention provides a new tool for the man skilled in the art to evaluate insulation deterioration.

Various modifications have been described in the system and method of the present invention. Other changes and modifications within the scope of the claims are intended to be within the scope and spirit of the invention.

We claim:

1. A system for detecting changes in insulation qualities of multi-phase equipment under operating conditions while the equipment remains connected to a multi-phase power line and ground comprising,
    a coupler unit for each phase connectable between ground and one phase of the multi-phase power line to which the equipment under test is connected and provided with means for sensing the current passing through that coupler unit to provide a sample signal for that phase,
    phase and amplitude adjustor means for each phase acting upon the amplitude and phase of the current sensed from each coupler unit to modify the same signal of that phase,
    ground current sensing means for sensing current in the ground connection of the equipment to provide a ground current sample signal representative of equipment ground current,
    a summing unit in which modified sample signals, respectively, from each phase, as modified by the respective phase and amplitude adjustor means are added and opposed to the ground current sample signal so that the sample signals cancel one another when the phase and amplitude means are adjusted to simulate the cumulative effect of the phases of the equipment, and
    null detector means coupled to the summing unit to detect when such cancellation occurs.

2. The system of claim 1 in which the multi-phase equipment under test and the power line are three-phase.

3. A system for detecting changes in insulation qualities of alternating current equipment under test under operating conditions while the equipment remains connected to a power line comprising,
    a coupler unit connectable between the power line to which the equipment under test is connected and ground and provided with means for sampling current passing through that coupler unit,
    phase and amplitude adjustor means acting upon the amplitude and phase of the current sample to provide a modified current sample,
    ground current sensing means for sensing current in the ground connection between the equipment and earth ground to provide a ground current sample,
    a summing unit in which effects of modified current samples, as modified by the phase and amplitude adjustor means, is opposed to the effect of the ground current sample as modified so that, when the phase and amplitude adjustor means are adjusted to simulate conditions of the equipment, the effects may be caused to cancel one another, and
    null detector means coupled to the summing unit to detect when such cancellation occurs.

4. A system for detecting changes in insulation qualities of each phase of multi-phase equipment under test under operating conditions while the equipment remains connected to a multi-phase power line and ground comprising,
    A coupler unit for each phase connectable between one phase of the multi-phase power line to which the equipment under test is connected and ground and provided with current sampling means for sampling current passing through that coupler unit, phase and amplitude adjustor means for each phase acting upon the phase and amplitude of the current sample to provide a modified current sample, ground current sensing means for sensing current in the ground connection of the equipment to provide a ground current sample, a summing unit in which effects a modified current samples, respectively, from each phase, as modified by the respective phase and amplitude adjustor means are added and opposed to the effect of the ground current sample so that, when the phase and amplitude adjustor means are adjusted to simulate conditions of the phases of the equipment, the effects may be caused to cancel one another, and null detector means coupled to the summing unit to detect when such cancellation occurs.

5. The system of claim 4 in which each coupler unit includes a coupling capacitor.

6. The system of claim 5 in which the current sampling means of each coupler unit consists of a current transformer.

7. The system of claim 4 in which the summing unit consists of a magnetic core having windings for each sample current and ground current and the phase and amplitude adjustor means of each phase consists of a variable turns device to vary amplitude and a variable resistor device to vary the phase to the summing unit windings for changing the effective number of turns of that windings.

8. A system for detecting changes in insulation qualities of three-phase equipment under test under operating conditions while the equipment remains connected to a three-phase power line and ground comprising, three coupling capacitors having a pair of cooperating plates, each capacitor having one of said plates connectable to a different phase of the three-phase power line to which the equipment under test is connected.

four current transformers, each having first and second magnetically coupled windings, each of three of said current transformers having said first winding connected in circuit between the second set of plates of the coupling capacitor and ground and the fourth current transformer having its first winding connectable into a sole ground lead of the equipment under test so that it lies in the path of ground current, an ampere-turn-summing transformer having a winding corresponding to each of the aforesaid current transformers and coupled through a coupling means to said respective second windings of said current transformers so that magnetomotive force generated by the currents from the three transformers connected to the coupling capacitors add and are opposed to magnetomotive force generated by the ground sample current from the equipment under test so that they will tend to null out one another, three phase and amplitude adjustor means respectively coupled between the secondary winding of the coupling capacitors' current transformers and their windings on the ampere-turn-summing transformer and adjustable to modify amplitude and phase to simulate modified sample phase currents for each phase conditions in their respective corresponding phases of the equipment under test, and null detector connected to a sensing winding of the ampere-turn summing transformer to detect when the sample ground current in the summing transformer cancels the sample phase currents, the phase and amplitude adjustor means being adjustable to simulate the cumulative effect of the three phases of the equipment.

9. A method of detecting changes in insulation qualities of the various phases of a multi-phase power equipment while the equipment remains connected between a multi-phase power line and ground, comprising, disconnecting all ground connections of said equipment except one and connecting a ground current sensing means therein to derive a sample signal representative of ground current, connecting separate coupler units between each different phase of the multi-phase power line to which the multi-phase power equipment are attached and ground, sensing current passing through each coupler unit to provide a sample signal for that phase, providing separate calibrated phase and amplitude adjustor means for each phase for the purpose of effectively changing phase and amplitude of the sample signal representative of current in that phase, and adding the sample signals representative of phase currents and opposing the same to the sample signal representative of ground current in a summing unit having a null detector, setting all but one of the phase and amplitude adjusting means at predetermined fixed settings simulating the conditions in the corresponding phase of equipment at a reference point of time and adjusting the settings of phase and amplitude of that one phase until the null detector shows null for both settings to obtain readings representative of capacitance and dissipation factor, or their equivalent, in that phase of the equipment under test.

10. The method of claim 9 in which the procedure is repeated for each of the other phases.

11. The method for claim 10 in which readings of each phase are compared with prior readings for the corresponding phases to determine changes in insulation properties in each of those phases.

12. A method of measurement of insulation qualities of the various phases of a piece of three-phase power equipment while it is still connected to the three-phase power line, comprising, disconnecting all ground connections of said equipment except one and connecting that one through one winding of a current transformer to ground, connecting one plate of each of three coupling capacitors to a different phase of the three-phase power line to which the three phases of the power equipment are attached and an opposed plate of each of the respective capacitors to ground through one winding of a different one of these current transformers.

connecting another winding of each of the four current transformers in circuits with separate windings on an ampere-turn summing transformer also having a sensing winding connected to an unbalance detector, so that the currents in the three windings coupled to the capacitors add and are opposed to the current in the winding coupled to equipment ground, providing separate phase and amplitude adjustor means in circuit with the secondary winding of each of the current transformers connected to the capacitors, each phase and amplitude adjustor means being calibrated to permit calibrated settings to predetermined conditions, setting two of the phase and amplitude adjustor means at predetermined fixed settings simulating the conditions in the corresponding phase of the equipment at a predetermined reference point and adjusting each of the settings of the third phase until the unbalance detector shows null in each case of amplitude and phase to obtain calibrated readings in that particular phase, repeating the procedure for each of the other two phases, and comparing readings with prior readings to determine changes in insulation properties.

13. The system of claim 3 in which an additional phase and amplitude adjustor means is provided in connection with the ground current sensing means to provide a modified ground current sample.

* * * * *